US012772900B2

(12) United States Patent
Choi et al.

(10) Patent No.: US 12,772,900 B2
(45) Date of Patent: Oct. 20, 2026

(54) LED DISPLAY APPARATUS WITH TRANSFERRED SUBSTRATE AND MANUFACTURING METHOD OF THE SAME

(71) Applicant: LG DISPLAY CO., LTD., Seoul (KR)

(72) Inventors: Jae Yong Choi, Paju-si (KR); Jae Min Sim, Paju-si (KR); Myung Soo Han, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 603 days.

(21) Appl. No.: 17/789,102

(22) PCT Filed: Nov. 12, 2020

(86) PCT No.: PCT/KR2020/015844
§ 371 (c)(1),
(2) Date: Jun. 24, 2022

(87) PCT Pub. No.: WO2021/132881
PCT Pub. Date: Jul. 1, 2021

(65) Prior Publication Data
US 2023/0037052 A1 Feb. 2, 2023

(30) Foreign Application Priority Data
Dec. 26, 2019 (KR) ........................ 10-2019-0175014

(51) Int. Cl.
*H10W 90/00* (2026.01)
*H10H 20/01* (2025.01)
(Continued)

(52) U.S. Cl.
CPC .......... *H10W 90/00* (2026.01); *H10H 20/815* (2025.01); *H10H 20/832* (2025.01);
(Continued)

(58) Field of Classification Search
CPC ..... H01L 25/0753; H01L 33/12; H01L 33/40; H01L 33/58; H01L 33/60; H10H 20/0363;
(Continued)

(56) References Cited

U.S. PATENT DOCUMENTS

2011/0000517 A1* 1/2011 Park .......................... H10N 10/17 136/200
2011/0140132 A1* 6/2011 Kang .................. H01L 25/0756 257/E33.062
(Continued)

FOREIGN PATENT DOCUMENTS

KR 10-2018-0052977 A 5/2018
KR 10-1890582 B1 8/2018
(Continued)

*Primary Examiner* — Norman D Richards
*Assistant Examiner* — Colin Russell Mccutcheon
(74) *Attorney, Agent, or Firm* — Birch, Stewart, Kolasch & Birch, LLP

(57) ABSTRACT

An LED display apparatus can include a common electrode layer on a first substrate, a second substrate including a first pixel driving device and a second pixel driving device, a first light emitting device on the common electrode layer and including a first n-type semiconductor layer, a first active layer, and a first p-type semiconductor layer, a second light emitting device on the common electrode layer and including a second n-type semiconductor layer, a second active layer, and a second p-type semiconductor layer, a black matrix between the first and second light emitting devices. The black matrix has a substantially same thickness as the first light emitting device and the second light emitting device to cover an entire area of a side of the first light emitting device and an entire area of a side of the second light emitting device.

21 Claims, 4 Drawing Sheets

(51) Int. Cl.

| | |
|---|---|
| ***H10H 20/815*** | (2025.01) |
| ***H10H 20/832*** | (2025.01) |
| ***H10H 20/855*** | (2025.01) |
| ***H10H 20/856*** | (2025.01) |
| ***H10H 20/857*** | (2025.01) |

(52) U.S. Cl.
CPC ........ *H10H 20/855* (2025.01); *H10H 20/856* (2025.01); *H10H 20/857* (2025.01); *H10H 20/032* (2025.01); *H10H 20/0363* (2025.01); *H10H 20/0364* (2025.01)

(58) Field of Classification Search
CPC ............. H10H 20/0364; H10H 20/032; H10H 20/832; H10H 20/855; H10H 20/857; H10H 20/815; H10H 20/856; H10W 90/00
USPC ........................................................... 257/89
See application file for complete search history.

(56) References Cited

U.S. PATENT DOCUMENTS

| | | | | |
|---|---|---|---|---|
| 2016/0372514 | A1* | 12/2016 | Chang | H01L 27/1259 |
| 2017/0338199 | A1 | 11/2017 | Zou et al. | |
| 2018/0350871 | A1* | 12/2018 | Lee | H01L 33/504 |
| 2018/0351033 | A1* | 12/2018 | Choi | H01L 33/382 |
| 2019/0164945 | A1* | 5/2019 | Chae | H01L 33/405 |
| 2019/0189679 | A1 | 6/2019 | Kwak et al. | |
| 2020/0058824 | A1* | 2/2020 | Jang | H01L 25/0756 |

FOREIGN PATENT DOCUMENTS

| | | | |
|---|---|---|---|
| KR | 10-2019-0076673 | A | 7/2019 |
| KR | 10-2019-0117968 | A | 10/2019 |

* cited by examiner

LED DISPLAY APPARATUS WITH TRANSFERRED SUBSTRATE AND MANUFACTURING METHOD OF THE SAME

CROSS REFERENCE TO RELATED APPLICATIONS

This application is the National Stage filing under 35 U.S.C. 371 of International Application No. PCT/KR2020/015844, filed on Nov. 12, 2020, which claims the benefit of earlier filing date and right of priority to Korean Patent Application No. 10-2019-0175014, filed on Dec. 26, 2019, the entire contents of all these applications are hereby incorporated by reference into the present application.

FIELD OF THE DISCLOSURE

The present invention relates to a LED (Light Emitting Diode) display apparatus and method of manufacturing thereof, and more particular to provide the LED display apparatus and method of manufacturing thereof capable of minimizing a serial process of growing a LED on a semiconductor substrate and then transferring it to a display substrate.

DESCRIPTION OF RELATED ART

The display apparatus is widely used as a display screen of a television, a monitor, a tablet computer, a smart phone, a portable display apparatus, and a portable information device, etc.

The display apparatus can be divided into a reflective display apparatus and a light emitting display apparatus and the information is displayed by reflecting the natural light or the light from the external light of the display apparatus at the inside of the display apparatus in the reflective display apparatus, a light emitting device or a light source is built into the display apparatus and then the information is displayed using the light from the built-in light emitting device or the built-in light source.

The light emitting device for emitting the light of the various wavelength can be used as the built-in light emitting device, and the light emitting device for emitting a white color light or a blue color light and a color filer for changing the wavelength of the emitted light can be used.

In order to display the image in the display apparatus, a plurality of light emitting device are disposed on the display substrate and a driving device for applying a driving signal and a driving current is disposed on the display substrate to control each light emitting device to emit light individually so that a plurality of light emitting devices arranged on the substrate are interpreted according to the arrangement of the information to be displayed and displayed on the substrate.

This display apparatus includes a plurality of pixels and a driving device, for example, a thin film transistor which is a switching device is disposed at each pixel and the image is displayed in each pixel by driving the thin film transistor.

Representative display apparatus using thin film transistors include a liquid crystal display apparatus and an organic light emitting display apparatus. Since the liquid crystal display apparatus is not a self-luminous apparatus, a backlight unit that emits light to the liquid crystal display apparatus is required.

Due to the additional backlight unit, the thickness of the liquid crystal display increases. In addition, there is a limitation in implementing various types of display apparatus such as flexible or circular shapes, and luminance and response speed may be reduced.

On the other hand, compared to the display apparatus including the light source, the display apparatus having a self-luminous device can realize the thin, flexible and foldable display apparatus.

The display apparatus including the self-light emitting device includes an organic light emitting display apparatus using an organic material as the light emitting device and a micro LED display apparatus using a micro LIGHT EMITTING DIODE as the light emitting device. Since the self-light emitting display apparatus such as the organic light emitting display apparatus or the micro LED display apparatus does not require a separate light source, it can be used as a thinner or various types of display apparatus.

However, although the organic light emitting display apparatus has an advantage of not requiring the separate light source, there is a problem in that defective pixels are generated due to moisture and oxygen. Accordingly, various technologies for minimizing the penetration of oxygen and moisture are additionally required in the organic light emitting display apparatus.

In order to solve this problem, the display apparatus using the micro light emitting diode (micro LED) of a fine size as the light emitting device is being researched and developed. Such the light emitting display apparatus has been spotlighted as a next-generation display apparatus because of high image quality and high reliability.

A micro light emitting diode of a microscopic size is a semiconductor light emitting apparatus that emits light when a current is supplied to a semiconductor, and is widely used in lighting, TV, and various display apparatus. The micro light emitting diode is composed of an n-type semiconductor layer, a p-type semiconductor layer, and an active layer therebetween. When the current is supplied, electrons are generated from the n-type semiconductor layer and the holes are generated from the p-type semiconductor layer, and then the electrons and the holes are combined in the active layer to emit light.

There are several technical requirements for realizing the light emitting display apparatus in which the micro light emitting diode is used as the light emitting device of a unit pixel. First, the micro light emitting diode is crystallized on a semiconductor wafer substrate such as sapphire or silicon (Si), and a plurality of crystallized LED chips are moved to the substrate having a driving device. In this case, a sophisticated transfer process of locating the micro light emitting diode at an accurate position corresponding to each pixel is required.

The micro light emitting diode uses an inorganic material, but the inorganic material must be formed by crystallization, and the inorganic material must be crystallized on the substrate that can induce crystallization when the inorganic material such as GaN is used. The substrate capable of efficiently inducing crystallization of the inorganic material is the semiconductor substrate.

The process of crystallizing the micro light emitting diode is also referred to as an epitaxy, an epitaxial growth, or an epi process. The epi process is to grow the crystal in a specific direction on the surface of the crystal. In order to form the micro light emitting diode, GaN-based compound semiconductors must be stacked on the substrate in the form of a pn junction diode, and each layer is grown by inheriting the crystallinity of the underlying layer.

At this time, the defect in the crystal acts as a nonradiative center in the electron-hole recombination process. Accordingly, crystallinity of crystals forming each layer has a decisive influence on device efficiency in the micro light emitting diode using photons.

The sapphire substrate is mainly used as the substrate of the micro light emitting diode and recently the GaN is also used as the substrate of the micro LED.

Compared to the simple lighting or the light source used for backlight, a large amount of LED is used in the display apparatus, however, since the cost of the semiconductor substrate is high, there is a problem in that the manufacturing cost increases of the display apparatus using a large amount of LED.

Further, although the step of transferring the micro light emitting diode formed on the semiconductor substrate to the substrate of the display apparatus is required, it is difficult to separate the micro light emitting diode formed on the semiconductor substrate in this process. In addition, there are many difficulties and problems in accurately transferring the separated micro light emitting diode to a desired position.

As the method of transferring the micro light emitting diode to the substrate of the display apparatus, there are various transfer methods such as the method using a transfer substrate using a polymer material such as PDMS, a transfer method using electromagnetic or static electricity, and a method of physically picking up and moving one element at a time, etc. can be used.

The transfer process is related to the productivity of the display apparatus manufacturing process. For mass production, it is inefficient to move the micro light emitting diode one by one.

Thus, the sophisticated transfer process or technique of separating a plurality of micro light emitting diodes from a semiconductor substrate using the transfer substrate using the polymer material and transferring the separated micro LED to the precise location on a pad electrode connected to the driving device and a power electrode of the display apparatus became necessary.

During the transfer process or during a subsequent process following the transfer process, defects such as the micro light emitting diode being transferred upside down by the external conditions such as the vibration or the heat while the micro light emitting diode is moved or transferred may occur. In addition, there were many difficulties in detecting and repairing such defects.

A general transfer process, for example, the transfer process of the micro light emitting diode will be described as follows. The micro light emitting diode is formed on a semiconductor substrate and an electrode is formed on the semiconductor layer to complete the individual micro light emitting diode. Thereafter, the semiconductor substrate and the PDMS substrate (hereinafter referred to as a transfer substrate) are contact for each other to move the micro light emitting diode to the transfer substrate. Since the micro light emitting diode must be transferred from the semiconductor substrate to the transfer substrate in consideration of the pixel distance of the display apparatus, a protrusion for accommodating the micro light emitting diode is disposed on the transfer substrate.

A laser is irradiated to the micro light emitting diode through the back surface of the semiconductor substrate to separate the micro light emitting diode from the semiconductor substrate. At this time, when irradiating a laser to separate the micro light emitting diode from the semiconductor substrate, the GaN material of the semiconductor substrate is physically rapidly expanded due to the concentration of high energy of the laser, which may cause an impact to the GaN material. (This is called the primary transfer.)

Thereafter, the micro light emitting diode transferred to the transfer substrate is transferred again on the substrate of the display apparatus. At this time, a passivation layer for insulating/protecting the thin film transistor is formed on the substrate provided with the thin film transistor, and then an adhesive layer is formed on the passivation layer.

When the transfer substrate is contacted with the substrate of the display apparatus and a pressure is applied thereto, the micro light emitting diode transferred to the transfer substrate is transferred to the substrate of the display apparatus by the adhesive layer formed on the passivation layer.

At this time, by making the adhesive force between the transfer substrate and the micro light emitting diode smaller than the adhesive force between the substrate of the display apparatus and the micro light emitting diode, the micro light emitting diode on the transfer substrate is smoothly transferred to the substrate of the display apparatus. (This is called secondary transfer)

A semiconductor substrate and the substrate of the display apparatus are basically different in size. In general, the substrate of the display apparatus is larger than the semiconductor substrate. Due to the difference in area and size, if the above-described primary and secondary transfers are performed for each of a plurality of regions of the substrate of the display apparatus, the micro light emitting diodes may be transferred to each of the plurality of pixels of the display apparatus.

The micro light emitting diodes formed on the semiconductor substrate may include red, blue, and green micro light emitting diodes. It may also include a white micro light emitting diode. Since the micro light emitting diodes emitting the light of different wavelengths are transferred to the pixel of the display apparatus, the number of the primary and secondary transfers may be further increased.

Since the micro light emitting diode is composed of a compound semiconductor such as GaN, high current can be injected due to the characteristics of the inorganic material, thereby realizing high luminance. Further, since the influence of the environment such as heat, moisture and oxygen are low, it has high reliability. In addition, since the micro light emitting diode has an internal quantum efficiency of 90%, which is higher than that of the organic light emitting display apparatus, it is possible to display a high-brightness image and realize the display apparatus with low power consumption.

Further, since the micro LED display apparatus uses the inorganic material, the influence of oxygen and moisture is very small. Therefore, since there is no need for a separate encapsulation film or an encapsulation substrate to minimize penetration of oxygen and moisture, it is possible to minimize the non-display area of the display apparatus, which is a margin area caused by the encapsulation film or the encapsulation substrate.

However, in the primary and secondary transfer processes of the micro LED display apparatus, many processes such as a process of arranging micro light emitting diodes and a process of connecting electrodes for supplying driving signals and current to the micro light emitting diodes are required and the precision of these processes must be high.

Accordingly, in the display apparatus using the micro light emitting diode as the light emitting device of the pixel, research to simplify the transfer process of the micro light emitting diode has been actively conducted.

DETAILED DESCRIPTION OF THE INVENTION

Technical Problem

In the LED display apparatus in which the micro light emitting diode is used as a light emitting device, in particular, in the LED display apparatus using the inorganic-based micro-sized micro LED as the light emitting device, since the encapsulating layer or the encapsulating substrate is not necessary in the display apparatus using the micro light emitting diode as described above, the bezel area can be minimized and a modular display apparatus using a plurality of display apparatus can be easily manufactured. However, there is a problem that defects may occur in the process of growing the micro light emitting diode on a separate substrate and transferring it to a display apparatus, and another defect may occur in the process of connecting the electrode to the micro light emitting diode. Accordingly, the inventors of the present invention have invented an LED display apparatus and a manufacturing method thereof capable of reducing a defect and improving process reliability by simplifying the process of transferring the micro light emitting diode.

An object of an embodiment of the present specification is to provide an LED display apparatus and a method manufacturing thereof device capable of minimizing a transfer process error by simplifying the step of transferring a micro light emitting diode.

Other object of the present invention is to provide an LED display apparatus and the method manufacturing thereof device capable of decreasing connection error of electrodes for supplying a current to the micro light emitting diode.

The problems to be solved according to the embodiment of the present invention are not limited to the problems mentioned above, and other problems not mentioned will be clearly understood by those skilled in the art from the following description.

Technical Solutions of Problem

The LED display apparatus according to the embodiment of the present specification is provided. A first substrate having a common electrode layer and a second substrate having a first pixel driving device and a second pixel driving device are bonded to each other to face each other. On the common electrode layer, a first light emitting device and a second light emitting device including an LED as a light emitting device are disposed as at least two light emitting devices. The first light emitting device includes a first n-type semiconductor layer, a first active layer, and a first p-type semiconductor layer, and the second light emitting device includes a second n-type semiconductor layer, a second active layer, and a second p-type semiconductor layer. In the above structure, the first p-type semiconductor layer and the first pixel driving device are electrically connected by a first connection electrode, and the second p-type semiconductor layer and the second pixel driving device are electrically connected by a second connection electrode. The LED display apparatus may further include a third light emitting device and a third pixel driving device and may be disposed similarly to the above-described structure. The common electrode layer and the first n-type semiconductor layer of the first light emitting device are separately formed of substantially the same material to have a direct connection relationship as an integral structure rather than a bonded structure, and the common electrode layer and the second n-type semiconductor layer are electrically connected by a third connection electrode. In this electrical connection relationship, by using the first light emitting device integrated with the common electrode layer, the process of transferring the micro light emitting diode can be minimized and process stability can be improved.

A method of manufacturing an LED display apparatus using a micro light emitting diode as a light emitting device according to an embodiment of the present specification is provided. The first substrate is a substrate such as sapphire on which a semiconductor can be grown, and a common electrode layer and a first n-type semiconductor layer are continuously grown on the first substrate. Thereafter, the first active layer and the first p-type semiconductor layer are grown and etched, remaining the common electrode layer on the first substrate to form the first light emitting device. Meanwhile, a first pixel driving device and a second pixel driving device are disposed on the second substrate as at least two pixel driving devices. A second light emitting device, which is a separately grown micro light emitting diode including a second n-type semiconductor layer, a second active layer, and a second p-type semiconductor layer, is disposed adjacent to the first light emitting device on the common electrode layer. The first and second substrates are bonded to each other, and a first connection electrode and a second connection electrode are disposed before bonding to connect respectively the first p-type semiconductor layer and the second p-type semiconductor layer to the first pixel driving device and the second pixel driving device, thereby the LED display apparatus may be manufactured. As described above, by the process of connecting the first light emitting device grown on the first substrate and the second light emitting device transferred on the common electrode layer to the pixel driving device, the manufacturing process is simplified and the process stability of the LED display apparatus using the micro light emitting diode as the emitting device may be improved.

Effect of the Invention

According to an embodiment of the present specification, by using at least one micro light emitting diode integrally formed with a common electrode layer as a light emitting device, there is an effect of reducing the process of transferring the micro light emitting diodes, thereby minimizing process defects.

In addition, by using the common electrode layer made of substantially the same material as the semiconductor layer of the micro light emitting diode, the number of connecting electrodes that additionally connect the micro light emitting diode and the common electrode layer can be reduced, thereby simplifying the process.

Effects of the present invention are not limited to the effects mentioned above, and other effects not mentioned will be clearly understood by those skilled in the art from the following description.

Since the content of the invention described in the problems to be solved above, the means for solving the problems, and the effects do not specify the essential characteristics of the claims, the scope of the claims is not limited by the matters described in the content of the invention.

BEST MODE OF THE INVENTION

Figure 1:
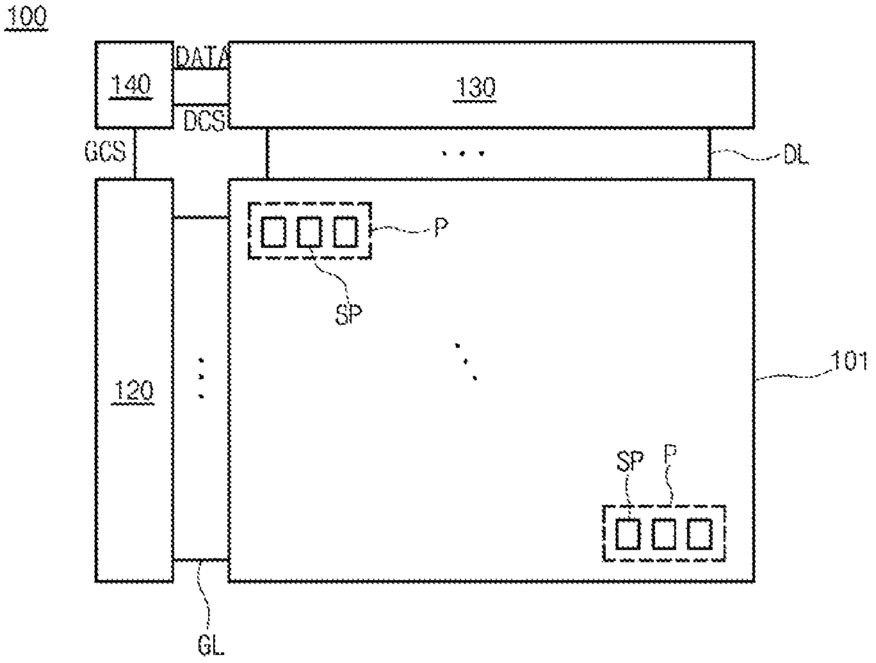
FIG. 1 is a view showing a schematic configuration of an LED display apparatus 100 according to an embodiment of the present disclosure.

Hereinafter, exemplary embodiments of the present invention will be described in detail with reference to the accompanying drawings. It should be understood that the present invention is not limited to the following embodiments and may be embodied in different ways, and that the embodiments are given to provide complete disclosure of the present invention and to provide thorough understanding of the present invention to those skilled in the art. The scope of the present invention is limited only by the accompanying claims and equivalents thereof.

In the drawings, the shapes, sizes, ratios, angles, and the number of components are provided for illustration only and do not limit the scope of the present invention. The same components will be denoted by the same reference numerals throughout the specification. Detailed description of known functions and constructions which can unnecessarily obscure the subject matter of the present invention will be omitted. The terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups there. As used herein, the singular forms "a", "an" and "the" are intended to include the plural forms as well, unless the context clearly indicates otherwise.

Unless stated otherwise, a margin of error is considered in analysis of components.

In description with spatially relative terms, for example, when an element is referred to as being disposed "on," "above," "below," or "beside" another element or layer, the element can be directly "on," "above," "below," or "beside" the other element or intervening elements may be present, unless stated otherwise.

In description of operations with temporal terms, for example, "after," "subsequent to," "before," or "followed by", the operations may be continuously or discontinuously performed, unless stated otherwise.

In description of the signal flow relationship, for example, even in the case of 'a signal is transmitted from node A to node B', unless 'directly' or 'directly' is used, it may include a case in which a signal is transmitted from node A to node B via another node.

Although the terms "first", "second", "A", "B", etc. may be used herein to describe various elements, components and/or regions, these elements, components and/or regions should not be limited by these terms. These terms are only used to distinguish one element, component or region from another element, component or region. Thus, a "first" element or component discussed below could also be termed a "second" element or component, or vice versa, without departing from the scope of the present invention.

Features of various embodiments of the present invention can be partially or entirely coupled to or combined with each other to realize various technical associations and operations and can be realized independently of each other or in association with each other.

Hereinafter, various embodiments will be described with reference to the accompanying drawings.

Referring to FIG. 1, the LED display apparatus 100 according to embodiments of the present invention can includes a display panel 101 in which a plurality of sub pixels SP including micro light emitting diodes μLED are arranged, a gate driving circuit 120 for driving the display panel 101, a data driving circuit 130, and a controller 140.

In the display panel 101, a plurality of gate lines GL and a plurality of data lines DL are disposed, and the sub pixel SP is disposed in the region where the gate line GL and the data line DL are intersected. Each of these sub-pixels SP may include a micro light emitting diode μLED, and one pixel P may include two or more sub-pixels SP.

The gate driving circuit 120 is controlled by the controller 140 and the scan signal is sequentially output to the plurality of gate lines GL in the display panel 101 to control a driving timing of the plurality of sub pixels.

The gate driving circuit 120 may include one or more gate driver integrated circuits (GDIC), and may be located on only one side or both sides of the display panel 101 depending on the driving method. Or, the gate driving circuit 120 may be located on the rear surface of the display panel 101.

The data driving circuit 130 receives the image data from the controller 140 and converts the image data into the analog data voltages. Further, the data voltage is output to each data line DL according to the timing when the scan signal is applied through the gate line GL, so that each sub pixel SP displays brightness according to image data.

The data driving circuit 130 may include one or more source driver integrated circuits SDICs.

The controller 140 supplies the various signal to the gate driving circuit 120 and the data driving circuit 130 and controls the operation of the gate driving circuit 120 and the data driving circuit 130.

The controller 140 causes the gate driving circuit 120 to output a scan signal according to the timing implemented in each frame, and converts externally received image data to match the data signal format used by the data driving circuit 130 and outputs the converted image data to the data driving circuit 130.

The various timing signals including the image data, a vertical synchronization signal (Vsync), a horizontal synchronization signal (Hsync), an input data enable signal (DE, Data Enable), and a clock signal (CLK) is applied to the controller 140 from the outside (e.g., a host system)

The controller 140 may generate various control signals using various timing signals received from the outside and output them to the gate driving circuit 120 and the data driving circuit 130.

For example, the controller 140 outputs various gate controlling signals including a gate start pulse (GSP), a gate shift clock (GSC), and a gate output enable signal (GOE) etc. in order to control the gate driving circuit 120.

Here, the gate start pulse (GSP) controls the driving start timing of one or more gate driver integrated circuits of the gate driving circuit 120. The gate shift clock (GSC), which is a clock signal commonly input to one or more gate driver integrated circuits, controls shift timing of the scan signal. The gate output enable signal (GOE) specifies timing information of one or more gate driver integrated circuits.

Further, the controller 140 outputs various data controlling signals including a source start pulse (SSP), a source sampling clock (SSC), and a source output enable (SOE) etc. to control the data driving circuit 130.

Here, the source start pulse (SSP) controls the data sampling start timing of one or more source driver integrated circuits of the data driving circuit 130. The source sampling clock (SSC) is the clock signal that controls sampling timing of data in each of the source driver integrated circuits. The source output enable signal (SOE) controls the output timing of the data driving circuit 130.

The LED display apparatus 100 may further include a power management integrated circuit for supplying the various voltages or the current to the display panel 101, gate driving circuit 120, and the data driving circuit 130 and controlling these voltages or the current A voltage line for supplying various signals or voltages may be disposed in the display panel 101 in addition to the gate line GL and the data line DL, and the micro light emitting diode μLED and the transistor for driving thereof may be disposed in each sub pixel SP.

Figure 2:
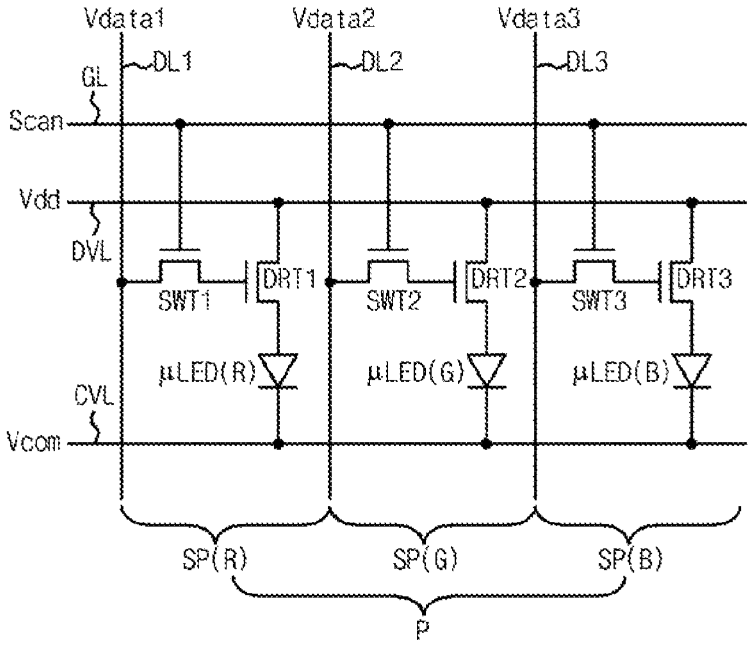
FIG. 2 is a schematic diagram for explaining a circuit structure of pixels arranged in the LED display apparatus 100 according to an embodiment of the present disclosure.

FIG. 2 shows an example of the circuit structure of the sub pixel SP of the LED display apparatus 100 according to embodiments of the present invention, wherein one pixel P includes three sub pixels SP.

Referring to FIG. 2, in addition to the gate line GL for supplying the scan signal and the data line DL for supplying data voltage Vdata, a driving voltage line DVL for supplying the driving voltage Vdd and a common voltage line CVL for supplying the common voltage Vcom may be disposed in the display panel 101.

Further, the sub pixels SP displaying red (R), green (G), and blue (B) colors are disposed in the intersection region of the gate line GL and the data line DL.

In each pixel SP, the micro light emitting diode μLED, one or more transistors for driving the micro light emitting diode μLED, and the capacitors may be disposed.

For example, the micro light emitting diode μLED for emitting red light, a first driving transistor DRT1 for driving the micro light emitting diode μLED, and a first switching transistor SWT1 for controlling a driving timing of the first driving transistor DRT1 may be disposed in the red sub pixel SP(R) at the intersect region of the first data line DL1 and the gate line GL.

Here, the first driving transistor DRT1 may be connected to the anode electrode of the micro light emitting diode μLED as shown in FIG. 2, but may also be connected to the cathode electrode of the micro light emitting diode μLED.

And, the storage capacitor for maintaining the data voltage Vdata for one image frame may be further disposed between the gate electrode and the source electrode (or drain electrode) of the first driving transistor DRT1.

When the scan signal Scan is applied through the gate line GL, the first switching transistor SWT1 is turned on, and then the first data voltage Vdata1 supplied through the first data line DL is applied to the gate electrode of the first driving transistor DRT1. Further, the driving voltage Vdd is applied to the anode electrode of the micro light emitting diode μLED according to the first data voltage Vdata1 and the common voltage Vcom is applied to the cathode electrode of the micro light emitting diode μLED. A micro light emitting diode (μLED) emits light according to the difference of the voltages applied to the anode electrode and the cathode electrode to express brightness.

The micro light emitting diodes μLEDs disposed in the green sub pixel SP(G) and the blue sub pixel SP(B) are driven in the same manner to display green (G) and blue (B) colors in the corresponding sub pixels SP.

Meanwhile, each of the micro light emitting diodes μLED disposed in the red sub pixel SP(R), the green sub pixel SP(G), and the blue sub pixel SP(B) are grown on separate wafer substrates corresponding thereto, and then the grown micro light emitting diodes μLED are transferred and positioned on the display panel 101.

Hereinafter, the configuration of the common electrode layer integrated micro light emitting diode μLED according to the embodiment of the present specification in which the number of micro light emitting diodes μLED grown on separate wafer substrates is minimized will be described in detail.

Figure 3:
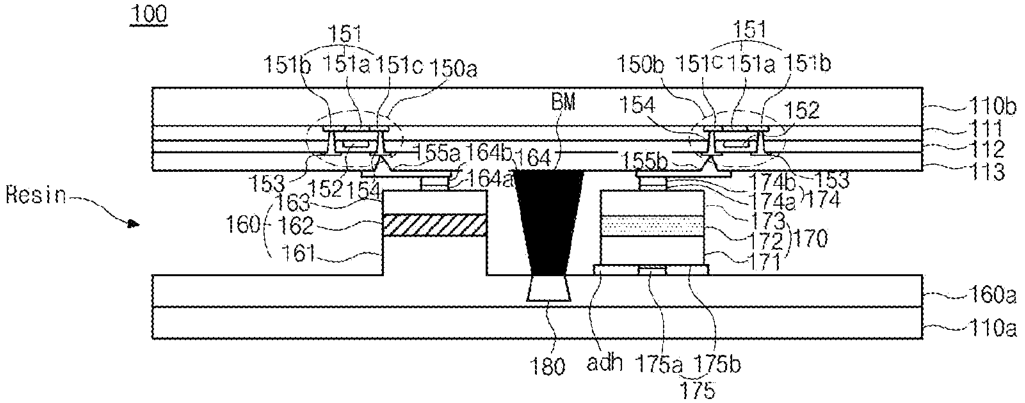
FIG. 3 is a schematic cross-sectional view for explaining the configuration of the pixel of the LED display apparatus 100 according to an embodiment of the present disclosure.

FIG. 3 is the schematic cross-sectional view for explaining the structure of the pixel of the LED display apparatus 100 according to the embodiment of the present specification. Referring to FIG. 3, the display panel 101 of the LED display apparatus 100 may include a first substrate 110*a* and a second substrate 110*b*.

The first substrate 110*a* includes a first light emitting device 160 and a second light emitting device 170 that are micro light emitting diodes μLED. The first light emitting device 160 is integral with the common electrode layer 160*a*, and one unit pixel P may include at least one first light emitting device 160. Meanwhile, the second light emitting device 170 is the micro light emitting diode that is grown on the separate semiconductor substrate and then transferred onto the common electrode layer 160*a* through the transfer process, and one unit pixel P may include at least one second light emitting device 170.

The second substrate 110*b* facing the first substrate 110*a* on which the micro light emitting diode is disposed includes a first pixel driving device 150*a* and a second pixel driving device 150*b* that are driving transistors.

The first substrate 110*a* and the second substrate 110*b* may be separately manufactured and bonded to each other, and an adhesive layer such as resin may be filled between the first substrate 110*a* and the second substrate 110*b* to bond the first substrate 110*a* and the second substrate 110*b*.

Hereinafter, each structure disposed on the first substrate 110*a* and the second substrate 110*b* will be described in more detail.

A common electrode layer 160*a* is disposed on the first substrate 110*a*. The first substrate 110*a* is a substrate such as sapphire on which the semiconductor layer can be substantially grown, and may further include a buffer layer for growing the semiconductor layer.

Further, the buffer layer is a low-temperature buffer layer which may be formed of material such as AlN or low-temperature GaN. The common electrode layer 160*a* on the first substrate 110*a* is an n-type semiconductor layer in which silicon (Si) is doped. As described above, the n-type semiconductor layer doped with silicon can form the common electrode layer 160*a* as a conductor.

The first light emitting device 160 is disposed on the common electrode layer 160*a*. The first light emitting device 160 has a structure in which a GaN-based compound semiconductor is grown in the form of a pn junction diode, each layer is a layer grown by inheriting the crystallinity of the underlying layer, and the first light emitting device 160 includes a first n-type semiconductor layer 161, a first active layer 162, a first p-type semiconductor layer 163, and a first device electrode 164*a* on the first p-type semiconductor layer 163.

As described above, since the first light emitting device 160 is sequentially grown (epi-growth) from the common electrode layer 160*a* on the first substrate 110*a*, a separate transferring process onto the common electrode layer 160*a* is not necessary.

Meanwhile, the second light emitting device 170 is disposed on the common electrode layer 160*a*. The unit pixel P is composed of at least one sub pixel SP, and each sub pixel SP is configured to emit the light of different wavelengths.

The second light emitting device 170 is the light emitting device that emits light having the wavelength different from that of the first light emitting device 160, and is grown on a separate semiconductor growth substrate (e.g., semiconductor substrate) and then disposed on the common electrode layer 160*a* through the transferring process.

However, in another embodiment of the present invention, the method of configuring the unit pixel P only with the plurality of first light emitting devices 160 may be used without the second light emitting device 170 grown on the separate semiconductor growth substrate, and in this case a color conversion layer corresponding to each of the first light emitting devices 160 may be further included. If the light emitting device grown on the separate semiconductor growth substrate is not used, the transferring process for transferring the light emitting device may not be required at all.

The first light emitting device 160 may be the light emitting device grown according to the lattice constant of the first substrate 110*a* based on the sapphire substrate, and the second light emitting device 170 may be the light emitting device grown on the separate semiconductor growth substrate base on the gallium arsenide (GaAs) substrate.

The second light emitting device 170 includes a second n-type semiconductor layer 171, a second active layer 172, a second p-type semiconductor layer 173, and a second device electrode 174*a* on the second p-type semiconductor layer 173, a third device electrode 175*a* may be formed on the first n-type semiconductor layer 171 to connect electrically the second light emitting device 170 to the common electrode layer 160*a*, and the second light emitting device 170 may be fixed on the common electrode layer 160*a* by a adhesive layer adh.

The second light emitting device 170 is electrically connected to the common electrode layer 160*a* through the third connection electrode 175, and the third connection electrode 175 may include the third device electrode 175*a* disposed on the first n-type semiconductor layer 171 and a third bonding electrode 175*b* including a conductive ball.

Meanwhile, the common electrode layer 160*a* may further include a light guide 180 to prevent color mixing of the light emitted from each of the first light emitting device 160 and the second light emitting device 170. The light guide 180 may be formed of an opaque conductive metal or the like for reflecting light, and may be formed by etching the surface of the common electrode layer 160*a* and then disposing above described metal in the etched surface.

In addition, a black matrix BM may be disposed between the first light emitting device 160 and the second light emitting device 170 to further prevent color mixing.

In the above configuration, although each of the first n-type semiconductor layer 161, the second n-type semiconductor layer 171, the first p-type semiconductor layer 163, and the second p-type semiconductor layer 173 are formed in the n-type semiconductor layer and p-type semiconductor layer, these layers may be formed in the p-type semiconductor layer and n-type semiconductor layer The first p-type semiconductor layer 163 and the second p-type semiconductor layer 173 are respectively disposed on the first active layer 162 and the second active layer 172 to supply respectively holes to the first active layer 162 and the second active layer 172. The first p-type semiconductor layer 163 and the second p-type semiconductor layer 173 according to the embodiment of the present specification may be formed of a p-GaN based semiconductor material, and the p-GaN based semiconductor material includes GaN and AlGaN, InGaN, or AlInGaN. Here, as an impurity used for doping the first p-type semiconductor layer 163 and the second p-type semiconductor layer 173, Mg, Zn, Be, or the like may be used.

The first n-type semiconductor layer 161 and the second n-type semiconductor layer 171 are respectively disposed on the first active layer 162 and the second active layer 172 to supply respectively electrons to the first active layer 162 and the second active layer 172. The first n-type semiconductor layer 161 and the second n-type semiconductor layer 171 according to the embodiment of the present specification may be formed of a-GaN based semiconductor material, and the n-GaN based semiconductor material includes GaN and AlGaN, InGaN, or AlInGaN. Here, as an impurity used for doping the first n-type semiconductor layer 161 and the second n-type semiconductor layer 171, Si, GE, Se, Te, C or the like may be used.

The first active layer 162 and the second active layer 172 are disposed on the first n-type semiconductor layer 161 and the second n-type semiconductor layer 171. The light emitting layers of the first active layer 162 and the second active layer 172 include a multi quantum well (MQW) structure having a well layer and a barrier layer having a higher band gap than the well layer. The first active layer 162 and the second active layer 172 according to the embodiment of the present invention may include the multi-quantum well structure such as InGaN/GaN.

Each of the first device electrode 164*a*, the second device electrode 174*a*, and the third device electrode 175*a* according to the embodiment of the present invention may be made of metal such as Au, W, Pt, Si, Ir, Ag, Cu, Ni, Ti. or Cr and an alloy including one or more of these metal, but is not limited thereto.

As described above, according to the exemplary embodiment of the present specification, the second substrate 110*b* includes the first pixel driving device 150*a* and the second pixel driving device 150*b* that are driving transistor.

Each of the first pixel driving device 150*a* and the second pixel driving device 150*b* includes an active layer 151, a gate electrode 152, a source electrode 153, and a drain electrode 154. Each of the first pixel driving device 150*a* and the second pixel driving device 150*b* according to the embodiment of the present specification is the thin film transistor using a poly silicon material as the active layer 151, that is, a low temperature poly silicon (LTPS) thin film transistor using low temperature poly silicon.

Since the poly silicon material has high mobility, energy consumption is low and reliability is excellent. The active layer 151 of the LTPS thin film transistor (hereinafter, the thin film transistor, the first pixel driving device 150*a* and the second pixel driving device 150*b*) includes a channel region 151*a*, in which a channel is formed when the thin film transistor is driven, and a source and drain region 151*b* and 151*c* on both sides of the channel region 151*a*.

The channel region 151*a*, the source region 151*b*, and the drain region 151*c* are defined by ion doping (impurity doping). A gate insulating layer 111 is disposed on the active layer 151, and the gate insulating layer 111 can be composed of a single layer such as silicon nitride (SiNx) or silicon oxide (SiOx), or multi layers including silicon nitride (SiNx) and silicon oxide (SiOx).

On the gate insulating layer 111, the gate electrode 152 is disposed so as to overlap the channel region 151*a* of the active layer 151. The gate electrode 152 may formed in a single layer structure made of any one of aluminum (Al), aluminum alloy (AlNd), copper (Cu), copper alloy, molybdenum (Mo), and molybdenum titanium (MoTi) having low resistance characteristics, the gate electrode 152 may formed in a double layer structure or triple layer structure composed of two or more layers.

Further, the first insulating layer 112 is disposed on the gate electrode 152, hydrogen contained in the first insulating layer 112 made of silicon nitride (SiNx) is diffused into the active layer 151 during a hydrogenation process for stabilizing the active layer 151 since the first insulating layer 112 is made of the silicon nitride (SiNx).

A passivation layer 113 is disposed on the first insulating layer 112, the passivation layer 113 may be made of the same material as the first insulating layer 112 or may be made of the organic insulating material for planarization.

For example, the passivation layer 113 may be made of one and more of materials such as polyacrylates resin, epoxy resin, phenolic resin, polyamides resin, polyimides resin, unsaturated polyesters resin, poly-phenylenethers resin, polyphenylenesulfides resin, and benzocyclobutene, but is not limited thereto. The passivation layer 117 may be formed as a single layer, double layers, or multiple layers.

A source electrode 153 and a drain electrode 154 connected to the source region 151*b* and the drain region 151*c*, respectively, are disposed on the first insulating layer 112. The source electrode 153 and the drain electrode 154 are made of any one or two or more materials of low resistance properties such as aluminum (Al), aluminum alloy (AlNd), copper (Cu), copper alloy, molybdenum (Mo), molybdenum titanium (MoTi), chromium (Cr), and titanium (Ti).

First and second pixel electrodes 155*a* and 155*b* are disposed on the passivation layer 113. The first and second pixel electrodes 155*a* and 155*b* may be formed of the metal having high reflectance, such as a stacked structure of aluminum (Ti) and titanium (Ti) (Ti/Al/Ti), a stacked structure of aluminum (Al) and ITO (ITO/Al/ITO), an APC alloy (Ag/Pd/Cu), and a stacked structure of an APC alloy and ITO (ITO/APC/ITO).

In the above description, a first connection electrode 164 may be disposed on the first light emitting device 160 for electrical connection with the first pixel driving device 150*a*. The first connection electrode 164 may include the first device electrode 164*a* and the first bonding electrode 164*b* including the conductive ball, and is electrically connected to the first pixel electrode 155*a* so as to be connected electrically to the first pixel driving device 150*a*.

In the above description, a second connection electrode 174 may be disposed on the second light emitting device 170 for electrical connection with the second pixel driving device 150*b*. The second connection electrode 174 may include the second device electrode 174*a* and the second bonding electrode 174*b* including the conductive ball, and is electrically connected to the second pixel electrode 155*b* so as to be connected electrically to the first pixel driving device 150*a*.

Figure 4:
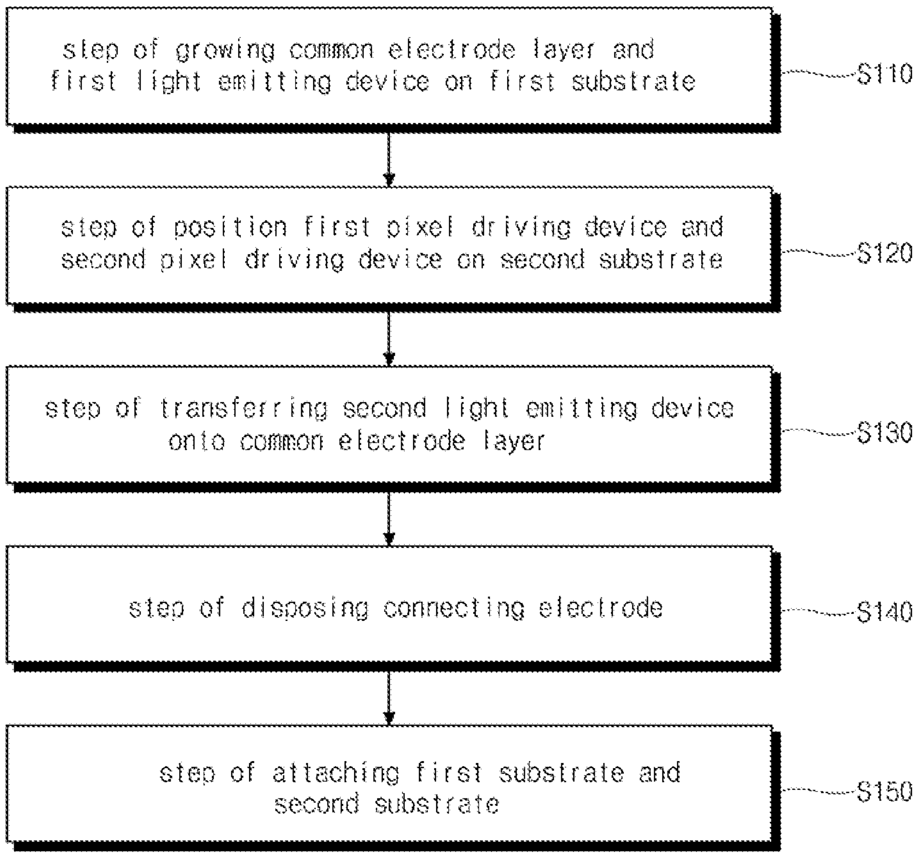
FIG. 4 is a schematic flowchart for explaining a method of manufacturing the LED display apparatus 100 according to an embodiment of the present disclosure.

FIG. 4 is a schematic flowchart for explaining the method of manufacturing the LED display apparatus 100 according to the embodiment of the present specification.

The first substrate may be the sapphire wafer substrate on which the semiconductor may be grown. After the nGaN based common electrode layer is formed on the first substrate, the first light emitting device including the first n-type semiconductor layer, the first active layer, and the first p-type semiconductor layer is continuously epi-grown on the first substrate (S110). The first light emitting device may be configured as an individual light emitting device by etching the epitaxially grown semiconductor layer. In this case, the buffer layer for buffering the lattice constant may be further formed on the first substrate.

Meanwhile, the first pixel driving device and the second pixel driving device are disposed on the second substrate (S120). The first pixel driving device and the second pixel driving device are thin film transistors, and are disposed to be electrically connected to the driving circuit for driving the pixel.

Subsequently, the second light emitting device including the second n-type semiconductor layer, the second active layer, and the second p-type semiconductor layer is transferred onto the common electrode layer on the first substrate (S130). The second light emitting device, which may be the light emitting device grown on the separate semiconductor growth substrate, is disposed on the common electrode layer through the transferring process, and in this case the step of disposing and bonding an adhesive layer and connection electrode may be further included.

Subsequently, the first and second substrates are bonded to each other (S140), the first p-type semiconductor layer and the first pixel driving device are electrically connected by disposing the first connection electrode and the second p-type semiconductor layer and the second pixel driving device are electrically connected by disposing the second connection electrode when the first substrate and the second substrate are bonded to each other (S150), thereby the LED display apparatus is manufactured. As described above, it is possible to provide the method of manufacturing the LED display apparatus in which the transferring process for transferring the light emitting device is minimized by using the method in which the common electrode layer and the first light emitting device are grown on the first substrate to use as the light emitting device.

Although the embodiments of the present invention have been described in more detail with reference to the accompanying drawings, the present invention is not necessarily limited to these embodiments, and various modifications may be made within the scope without departing from the technical spirit of the present invention. Therefore, the embodiments disclosed in the present invention are not intended to limit the technical spirit of the present invention, but to explain, and the scope of the technical spirit of the present invention is not limited by these embodiments. Therefore, it should be understood that the embodiments described above are illustrative in all respects and not restrictive. The protection scope of the present invention should be construed by the claims, and all technical ideas within the scope equivalent thereto should be construed as being included in the scope of the present invention.

What is claimed is:

1. A light emitting diode (LED) display apparatus, comprising a common electrode layer on a first substrate;

a second substrate including a first pixel driving device and a second pixel driving device;

a first light emitting device on the common electrode layer, the first light emitting device including a first n-type semiconductor layer, a first active layer, and a first p-type semiconductor layer;

a second light emitting device on the common electrode layer, the second light emitting device including a second n-type semiconductor layer, a second active layer, and a second p-type semiconductor layer;

a black matrix between the first light emitting device and the second light emitting device;

a light mixing preventing layer disposed between the first light emitting device and the second light emitting device to block light incident from the first light emitting device and the second light emitting device;

a first connection electrode configured to connect the first p-type semiconductor layer to the first pixel driving device; and a second connection electrode configured to connect the second p-type semiconductor layer to the second pixel driving device, wherein the common electrode layer is made of a same material as the first n-type semiconductor layer and is directly connected to the first n-type semiconductor layer, wherein the LED display apparatus further comprises a third connection electrode configured to connect the common electrode layer to the second n-type semiconductor layer, wherein the black matrix totally covers an entire area of sides of the first n-type semiconductor layer, the first active layer, and the first p-type semiconductor layer of the first light emitting device and an entire area of sides of the second n-type semiconductor layer, the second active layer, and the second p-type semiconductor layer of the second light emitting device, and wherein the light mixing preventing layer is aligned vertically with the black matrix.

2. The LED display apparatus of claim 1, wherein the common electrode layer is disposed on an entire area of the first substrate.

3. The LED display apparatus of claim 1, wherein the first active layer and the second active layer are configured to emit light of different wavelengths.

4. The LED display apparatus of claim 1, wherein the first active layer is configured to emit light of a blue wavelength or a green wavelength.

5. The LED display apparatus of claim 1, further comprising a buffer layer configured to buffer a lattice constant between two layers of the first substrate and the common electrode layer, wherein the common electrode layer is grown on the first substrate by an epitaxy process.

6. The LED display apparatus of claim 1, wherein the first substrate is a sapphire substrate.

7. The LED display apparatus of claim 1, wherein the common electrode layer is an nGaN layer doped with Si.

8. The LED display apparatus of claim 1, wherein the light mixing preventing layer is a light guide layer made of a different material from the common electrode layer.

9. The LED display apparatus of claim 1, further comprising a third light emitting device on the common electrode layer, wherein the first light emitting device, the second light emitting device, and the third light emitting device emit light of different wavelengths.

10. The LED display apparatus of claim 1, wherein the first light emitting device and the second light emitting device are disposed on an upper surface of the first substrate, and the first pixel driving device and the second pixel driving device are disposed on a lower surface of the second substrate facing the upper surface of the first substrate.

11. The LED display apparatus of claim 1, wherein the common electrode layer under the first light emitting device and the common electrode layer under the second light emitting device are integrally formed so that the first light emitting device and the second light emitting device are electrically connected to the common electrode layer in parallel.

12. The LED display apparatus of claim 1, wherein the first n-type semiconductor layer, the first active layer, and the first p-type semiconductor layer of the first light emitting device are continuously grown from the common electrode layer, and wherein the second n-type semiconductor layer, the second active layer, and the second p-type semiconductor layer of the second light emitting device are grown in a separate semiconductor substrate and then transferred on the common electrode layer.

13. The LED display apparatus of claim 8, wherein the light mixing preventing layer is made of an opaque conductive material for reflecting light.

14. The LED display apparatus of claim 1, wherein the light mixing preventing layer is formed inside of the common electrode layer.

15. A method of manufacturing a light emitting diode (LED) display apparatus, the method comprising:

forming a common electrode layer on a first substrate and subsequently growing a first light emitting device including a first n-type semiconductor layer, a first active layer, and a first p-type semiconductor layer;

disposing a first pixel driving device and a second pixel driving device on a second substrate;

transferring a second light emitting device including a second n-type semiconductor layer, a second active layer, and a second p-type semiconductor layer on the common electrode layer;

forming a light mixing preventing layer disposed between the first light emitting device and the second light emitting device to block light incident from the first light emitting device and the second light emitting device;

forming a black matrix between the first light emitting device and the second light emitting device;

bonding the first substrate and the second substrate to each other;

disposing a first connection electrode to connect the first p-type semiconductor layer to the first pixel driving device; and disposing a second connection electrode to connect the second p-type semiconductor layer to the second pixel driving device, wherein the black matrix totally covers an entire area of sides of the first n-type semiconductor layer, the first active layer, and the first p-type semiconductor layer of the first light emitting device and an entire area of sides of the second n-type semiconductor layer, the second active layer, and the second p-type semiconductor layer of the second light emitting device, and wherein the light mixing preventing layer is aligned vertically with the black matrix.

16. The method of claim 15, wherein the forming the common electrode layer and the growing the first light emitting device on the first substrate include growing continuously a semiconductor layer and etching thereof to form the first light emitting device.

17. The method of claim 15, wherein the forming the common electrode on the first substrate further includes forming a buffer layer to buffer a lattice constant on the first substrate.

18. The method of claim 15, wherein the transferring the second light emitting device on the common electrode layer further includes:

providing the second light emitting device grown on a third substrate; and disposing an adhere layer on the common electrode layer to attach the second light emitting device thereto.

19. The method of claim 15, wherein the transferring the second light emitting device on the common electrode includes disposing a third connection electrode on the common electrode layer to connect the second light emitting device thereto.

20. The method of claim 15, wherein the common electrode layer is an nGaN layer doped with Si.

21. The method of claim 15, wherein the light mixing preventing layer is a light guide layer made of a conductive material for reflecting light.

* * * * *